United States Patent
Park et al.

(10) Patent No.: US 11,596,159 B2
(45) Date of Patent: Mar. 7, 2023

(54) MEAT-AGING APPARATUS, MEAT-AGING METHOD THEREOF, AND MEAT-AGING SYSTEM AND REFRIGERATOR

(71) Applicant: Samsung Electronics Co., Ltd, Gyeonggi-do (KR)

(72) Inventors: Dae-wook Park, Hwaseong-si (KR); Soon-cheol Kweon, Seoul (KR); Jin-hoon Kim, Suwon-si (KR); Hong-il Kim, Yongin-si (KR); Han-gil Moon, Daejeon (KR); Ji-hwan Woo, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 831 days.

(21) Appl. No.: 16/067,565

(22) PCT Filed: Dec. 30, 2016

(86) PCT No.: PCT/KR2016/015538
§ 371 (c)(1),
(2) Date: Jun. 29, 2018

(87) PCT Pub. No.: WO2017/116195
PCT Pub. Date: Jul. 6, 2017

(65) Prior Publication Data
US 2019/0008173 A1    Jan. 10, 2019

(30) Foreign Application Priority Data

Dec. 30, 2015    (KR) .................. 10-2015-0190202

(51) Int. Cl.
*A23B 4/015*    (2006.01)
*F25D 29/00*    (2006.01)
(Continued)

(52) U.S. Cl.
CPC ................. *A23B 4/015* (2013.01); *A23B 4/01* (2013.01); *A23L 13/00* (2016.08); *F25D 11/02* (2013.01);
(Continued)

(58) Field of Classification Search
CPC . A23B 4/01; A23B 4/015; A23L 13/00; A23L 13/76; A23L 3/005; A23L 3/0055;
(Continued)

(56) References Cited

U.S. PATENT DOCUMENTS 4,233,323 A * 11/1980 Sway ...................... A23L 13/76
426/248
5,530,229 A    6/1996 Gong et al.
(Continued)

FOREIGN PATENT DOCUMENTS

GB    2437171 A * 10/2007 ............. A23B 4/015
JP    H06125759 A * 5/1994
(Continued)

OTHER PUBLICATIONS

International Search Report dated Apr. 20, 2017 in connection with International Patent Application No. PCT/KR2016/015538.
(Continued)

*Primary Examiner* — Drew E Becker
*Assistant Examiner* — Austin Parker Taylor

(57) ABSTRACT

A meat-aging apparatus is disclosed. The meat-aging apparatus comprises: a photographing unit for photographing meat stored in the meat-aging apparatus; an illumination unit for irradiating light to the meat; a storage unit for storing recipe information for aging the meat according to the type or state of the meat; and a processor for determining the type or state of the meat on the basis of a photographed image, and controlling the illumination unit to irradiate light to the meat according to the recipe information corresponding to
(Continued)

the determined type or state of the meat in order to age the meat.

5 Claims, 21 Drawing Sheets

(51) Int. Cl.

| | |
|---|---|
| *G06Q 10/10* | (2023.01) |
| *F25D 23/04* | (2006.01) |
| *A23L 13/00* | (2016.01) |
| *F25D 27/00* | (2006.01) |
| *F25D 17/04* | (2006.01) |
| *A23B 4/01* | (2006.01) |
| *F25D 11/02* | (2006.01) |
| *F25D 21/00* | (2006.01) |
| *H01L 33/50* | (2010.01) |
| *H01L 25/075* | (2006.01) |
| *H05B 45/325* | (2020.01) |
| *H01L 27/15* | (2006.01) |
| *H01L 33/52* | (2010.01) |
| *H01L 33/60* | (2010.01) |
| *H01L 33/62* | (2010.01) |

(52) U.S. Cl.
CPC .......... *F25D 17/042* (2013.01); *F25D 21/00* (2013.01); *F25D 23/04* (2013.01); *F25D 27/00* (2013.01); *F25D 27/005* (2013.01); *F25D 29/00* (2013.01); *G06Q 10/10* (2013.01); *A23V 2002/00* (2013.01); *F25D 2317/0417* (2013.01); *F25D 2400/361* (2013.01); *F25D 2600/02* (2013.01); *F25D 2700/06* (2013.01); *F25D 2700/08* (2013.01); *H01L 25/0753* (2013.01); *H01L 27/156* (2013.01); *H01L 33/504* (2013.01); *H01L 33/507* (2013.01); *H01L 33/52* (2013.01); *H01L 33/60* (2013.01); *H01L 33/62* (2013.01); *H05B 45/325* (2020.01)

(58) Field of Classification Search
CPC ......... A23L 3/26; A23L 3/28; A23V 2002/00; F25D 11/02; F25D 17/042; A22C 9/00; A22C 9/002; A22C 17/0073; A22C 17/008; A22C 17/0086
USPC ........................................................ 426/231
See application file for complete search history.

(56) References Cited

U.S. PATENT DOCUMENTS

| | | | |
|---|---|---|---|
| 5,536,515 | A | 7/1996 | Woo |
| 9,269,133 | B2 | 2/2016 | Cho et al. |
| 2006/0249029 | A1 | 11/2006 | Hahm et al. |
| 2008/0066475 | A1* | 3/2008 | Cho .......... A23L 3/36 62/130 |
| 2008/0307818 | A1* | 12/2008 | Min ......... F25D 27/00 700/275 |
| 2009/0093037 | A1 | 4/2009 | Kim et al. |
| 2009/0142458 | A1* | 6/2009 | McCann ........ F25B 47/02 426/231 |
| 2010/0310736 | A1* | 12/2010 | Burke ........... A23B 4/015 426/418 |
| 2012/0042664 | A1* | 2/2012 | Lee ........... A23L 13/76 62/157 |

FOREIGN PATENT DOCUMENTS

| | | | |
|---|---|---|---|
| JP | 2007046848 A | 2/2007 | |
| JP | 2014050339 A | 3/2014 | |
| KR | 10-1990-0011398 A | 8/1990 | |
| KR | 10-1991-0001502 A | 1/1991 | |
| KR | 10-1991-0008360 A | 5/1991 | |
| KR | 10-1991-0012632 A | 8/1991 | |
| KR | 10-1994-0007490 A | 4/1994 | |
| KR | 10-1994-0011866 A | 6/1994 | |
| KR | 10-1994-0013337 A | 7/1994 | |
| KR | 10-1994-0024338 A | 11/1994 | |
| KR | 10-1995-0019583 A | 7/1995 | |
| KR | 10-1995-0023306 A | 8/1995 | |
| KR | 10-1995-0025384 A | 9/1995 | |
| KR | 10-1995-0026369 A | 10/1995 | |
| KR | 10-1996-0000035 A | 1/1996 | |
| KR | 10-1996-0020700 A | 7/1996 | |
| KR | 0129228 B1 | 11/1997 | |
| KR | 0129236 B1 | 11/1997 | |
| KR | 0129237 B1 | 4/1998 | |
| KR | 10-0193788 B1 | 2/1999 | |
| KR | 10-0213022 B1 | 5/1999 | |
| KR | 10-0215827 B1 | 5/1999 | |
| KR | 10-0218421 B1 | 9/1999 | |
| KR | 10-0296299 B1 | 5/2000 | |
| KR | 10-2004-0007038 A | 1/2004 | |
| KR | 10-2004-0012330 A | 2/2004 | |
| KR | 10-2004-0059612 A | 7/2004 | |
| KR | 10-2005-0087606 A | 8/2005 | |
| KR | 10-0556367 B1 | 2/2006 | |
| KR | 10-2006-0044121 A | 5/2006 | |
| KR | 10-0595720 B1 | 7/2006 | |
| KR | 10-2006-0114924 A | 11/2006 | |
| KR | 10-0648810 B1 | 11/2006 | |
| KR | 10-2007-0005184 A | 1/2007 | |
| KR | 10-0751392 B1 | 8/2007 | |
| KR | 10-0751393 B1 | 8/2007 | |
| KR | 10-0774191 B1 | 11/2007 | |
| KR | 10-0820817 B1 | 4/2008 | |
| KR | 10-0826715 B1 | 4/2008 | |
| KR | 10-0880636 B1 | 1/2009 | |
| KR | 10-2009-0034598 A | 4/2009 | |
| KR | 10-2010-0019858 A | 2/2010 | |
| KR | 10-2010-0059621 A | 6/2010 | |
| KR | 20110018562 A * | 2/2011 | |
| KR | 10-1057730 B1 | 8/2011 | |
| KR | 101057730 B1 * | 8/2011 | |
| KR | 10-2012-0123978 A | 11/2012 | |
| KR | 10-1254420 B1 | 4/2013 | |
| KR | 10-1284592 B1 | 7/2013 | |
| KR | 10-1372321 B1 | 3/2014 | |
| KR | 101438257 B1 * | 9/2014 | |
| KR | 10-2014-0133337 A | 11/2014 | |
| KR | 10-2015-0000526 A | 1/2015 | |
| KR | 20150118867 A * | 10/2015 | |
| KR | 10-2015-0124771 A | 11/2015 | |
| WO | WO-2013010717 A1 * | 1/2013 | .......... H05B 33/086 |
| WO | WO-2014169901 A1 * | 10/2014 | ............ A23B 4/027 |

OTHER PUBLICATIONS

Written Opinion of the International Searching Authority dated Apr. 20, 2017 in connection with International Patent Application No. PCT/KR2016/015538.

Request for the Submission of an Opinion dated Sep. 21, 2022 in connection with Korean Patent Application No. 10-2015-0190202, 34 pages.

* cited by examiner

MEAT-AGING APPARATUS, MEAT-AGING METHOD THEREOF, AND MEAT-AGING SYSTEM AND REFRIGERATOR

CROSS-REFERENCE TO RELATED APPLICATIONS AND CLAIM OF PRIORITY

This application is a 371 of International Application No. PCT/KR2016/015538 filed Dec. 30, 2016, which claims priority to Korean Patent Application No. 10-2015-0190202 filed Dec. 30, 2015, the disclosures of which are herein incorporated by reference in their entirety.

BACKGROUND

1. Field

Devices and methods consistent with what is disclosed herein relate to a meat-aging apparatus, a meat-aging method thereof, a meat-aging system and a refrigerator, and more particularly, to a meat-aging apparatus to which various types of aging methods are employed according to type of meat, a meat-aging method thereof, a meat-aging system and a refrigerator.

2. Description of Related Art

There has been developed an apparatus for preventing food from being rotten for a long time and recently, apparatuses specialized in storage of particular food such as kimchi or wine, for example, a kimchi-refrigerator or a wine cellar, have been developed.

Various methods for aging food are known to store food for a long time or add flavor of food.

For example, there are a method of aging a salted vegetable such as kimchi by keeping it in a cold place, a method of dry-aging meat by hanging it on a ceiling, and a method of aging meat by vacuum packing the meat and leaving the meat in a humid condition for a long time.

However, an aging process of food requires many efforts since the environment of food needs to be changed according to the aging degree of food, and aging food takes a long time.

Further, a process of aging meat is very difficult since flavor of meat is enriched as long as the meat is aged properly, but the meat becomes easily spoiled and rotten if it is not carefully controlled.

Accordingly, an easy way to reach the target aging degree of meat has been in high demand.

SUMMARY

One technical task of the present disclosure is to provide a meat-aging apparatus for easily aging meat, a meat-aging method thereof, a meat-aging system, and a refrigerator.

According to an exemplary embodiment, there is provided a meat-aging apparatus including a photographing unit configured to photograph an image of meat stored in the meat-aging apparatus, an illumination unit configured to irradiate light to the meat, a storage configured to store recipe information for aging the meat according to a type or state of the meat, and a processor configured to determine a type or state of the meat based on the photographed image and control the illumination unit to irradiate light to the meat according to recipe information corresponding to the determined type or state of the meat for aging the meat.

The recipe information may include information on at least one of a wavelength, an intensity and an irradiation time of light to be irradiated to the meat for aging the meat according to the type or state of the meat.

The recipe information may include information on at least one of a wavelength, an intensity and an irradiation time of light to be irradiated to the meat by aging degree for aging the meat with different aging degrees according to the type or state of the meat.

The processor may be further configured to control the illumination unit to irradiate light for sterilizing the meat to the meat, and light for sterilizing and aging the meat may be light of different wavelengths.

The storage may be further configured to store an image indicating a type or state of meat, and the processor may be further configured to compare the photographed image with the stored image and determine a type or state of the meat.

The state of the meat may include at least one of a state according to an elapsed time after the meat is slaughtered, a state according to an elapsed time after the meat is frozen, a state according to an elapsed time since the frozen meat is defrosted, and a state according to an aging degree of the meat.

The processor may be further configured to control the photographing unit to photograph the meat at a predetermined time, determine an aging degree of the meat based on an image of meat photographed at the predetermined time, and provide information on the determined aging degree of the meat.

The storage may be further configured to store an image indicating an aging degree of meat, and the processor may be further configured to compare the photographed image of the meat with the stored image and determine an aging degree of the meat.

According to an exemplary embodiment, there is provided a meat-aging method, the method may include photographing an image of meat, determining a type or state of the meat based on the photographed image, and irradiating light to the meat according to recipe information corresponding to the determined type or state of the meat.

The recipe information may include information on at least one of a wavelength, an intensity and an irradiation time of light to be irradiated to the meat for aging the meat according to the type or state of the meat.

The recipe information may include information on at least one of a wavelength, an intensity and an irradiation time of light to be irradiated to the meat by aging degree for aging the meat with different aging degrees according to the type or state of the meat.

The method may further include irradiating light for sterilization to the meat, wherein light for sterilizing and aging the meat is light of different wavelengths.

The determining of the type or state of the meat may include comparing the photographed image and an image indicating a type or state of meat and determining a type or state of the meat.

The state of the meat may include at least one of a state according to an elapsed time after the meat is slaughtered, a state according to an elapsed time after the meat is frozen, a state according to an elapsed time since the frozen meat is defrosted, and a state according to an aging degree of the meat.

The photographing of the meat may include photographing the meat at a predetermined time, and the method may further include determining an aging degree of the meat based on an image of meat photographed at the predetermined time and providing information on the determined aging degree of the meat.

The determining of the aging degree of the meat may include comparing the photographed image of the meat with an image indicating an aging degree of meat and determining an aging degree of the meat.

According to an exemplary embodiment, there is provided a refrigerator including a photographing unit configured to photograph an image of meat stored in the refrigerator, an illumination unit configured to irradiate light to the meat, a storage configured to store recipe information for aging and sterilizing the meat according to a type or state of the meat, and a processor configured to determine a type or state of the meat based on the photographed image, and control the illumination unit to irradiate light to the meat according to recipe information corresponding to the determined type or state of the meat for aging the meat.

The refrigerator may further include a plurality of chambers each having a predetermined temperature and humidity, and the processor may be further configured to determine an aging degree of the meat based on the photographed image of the meat, determine a chamber suitable for storing the meat from among the plurality of chambers according to the aging degree of the meat, and provide information on the determined chamber.

The refrigerator may further include an input unit for receiving a user command that selects one piece of recipe information for aging the meat, and the processor may be further configured to, based on the input user command, control the illumination unit to irradiate light according to recipe information selected by the user command.

According to an exemplary embodiment, there is provided a meat-aging system including a server configured to store recipe information for aging meat by using light, and a meat-aging apparatus configured to receive recipe information corresponding to a type or state of meat from the server and irradiate light to the meat according to the received recipe information for aging the meat.

The server may be further configured to, in response to a recipe transmission request received from the meat-aging apparatus, select one piece of recipe information corresponding to the type or state of the meat based on at least one of user preference and download count, and transmit the selected piece of recipe information to the meat-aging apparatus.

The server may use the recipe information and user preference received from the meat-aging apparatus and update the pre-stored recipe information and user preference.

The meat-aging apparatus may transmit at least one of history information on the meat and the photographed image of the meat to the server, and the server may be further configured to determine a type or state of the meat based on at least one of received history information of image received from the meat-aging apparatus, and transmit recipe information corresponding to the determined type or state of the meat to the meat-aging apparatus.

According to another exemplary embodiment, there is provided a meat-aging method by using light may include determining an aging degree of meat, selecting recipe information for aging the meat according to a type or state of the meat based on a predetermined target aging degree and an aging degree of the meat, and irradiating light to the meat according to the selected recipe information.

The determining may include photographing an image of the meat, and determining an aging degree of the meat based on the photographed image of the meat.

The meat-aging method may further include receiving a user command indicating an age degree of the meat, and the determining may include, based on the received user command, determining an aging degree of the meat by prioritizing the user command.

The recipe information may include information on irradiation time of light to be irradiated to the meat for aging the meat, and the selecting may include selecting recipe information where irradiation time of light to be irradiated to the meat is relatively long as a difference between the predetermined target aging degree and the aging degree of the meat increases.

According to various embodiments, a user may easily age meat by using various recipe information through automation of device.

DETAILED DESCRIPTION

Figure 1:
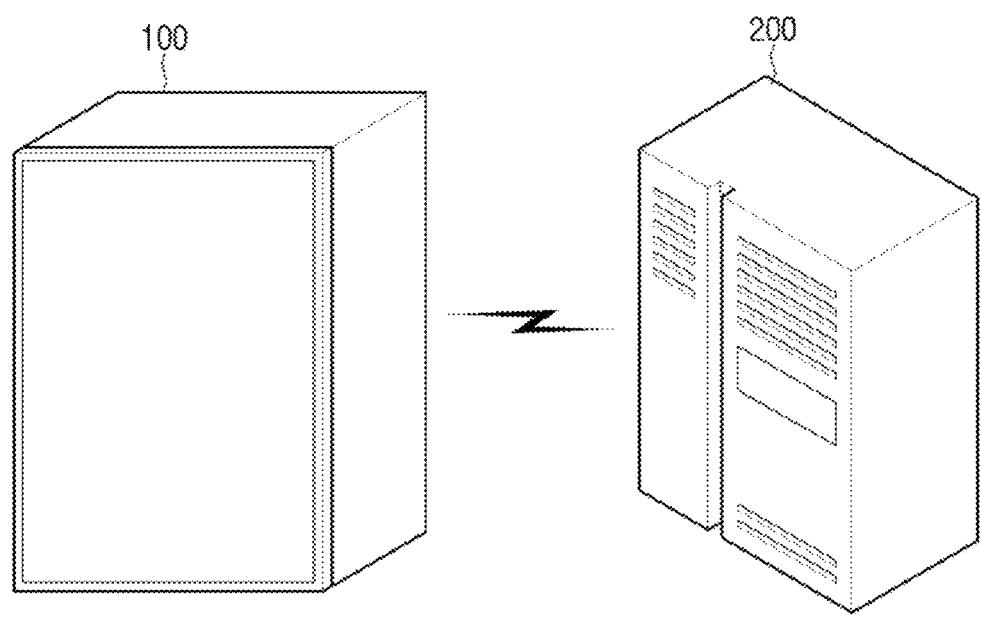
FIG. 1 is a block view illustrating configuration of a meat-aging system according to an embodiment of the present disclosure.

Hereinafter, embodiments of the present disclosure will be described in detail with reference to the accompanying drawings.

All the terms used in this specification including technical and scientific terms have the same meanings as would be generally understood by those skilled in the related art. However, these terms may vary depending on the intentions of the person skilled in the art, legal or technical interpretation, and the emergence of new technologies. In addition, some terms are arbitrarily selected by the applicant. These terms may be construed in the meaning defined herein and, unless otherwise specified, may be construed on the basis of the entire contents of this specification and common technical knowledge in the art.

In addition, the same reference numerals as used in the accompanying drawings denote parts or components performing substantially the same function. For ease of explanation and understanding, different embodiments will be described using the same reference numerals. In other words, even though all the elements having the same reference numerals are shown in the plural drawings, the plural drawings do not mean one embodiment.

The terms such as "first," "second," and so on may be used to describe a variety of elements, but the elements should not be limited by these terms. The terms are used simply to distinguish one element from other elements. The use of such ordinal numbers should not be construed as limiting the meaning of the term. For example, the components associated with such an ordinal number should not be limited in the order of use, placement order, or the like. If necessary, each ordinal number may be used interchangeably.

The singular expression also includes the plural meaning as long as it does not differently mean in the context. In this specification, terms such as 'include' and 'have/has' should be construed as designating that there are such characteristics, numbers, operations, elements, components or a combination thereof in the specification, not to exclude the existence or possibility of adding one or more of other characteristics, numbers, operations, elements, components or a combination thereof.

In an exemplary embodiment, 'a module', 'a unit', or 'a part' perform at least one function or operation, and may be realized as hardware, such as a processor or integrated circuit, software that is executed by a processor, or a combination thereof. In addition, a plurality of 'modules', a plurality of 'units', or a plurality of 'parts' may be integrated into at least one module or chip and may be realized as at least one processor except for 'modules', 'units' or 'parts' that should be realized in a specific hardware.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

In the following description, the configuration which is publicly known but irrelevant to the gist of the present disclosure could be omitted.

FIG. 1 is a block view illustrating configuration of a meat-aging system 10 according to an embodiment of the present disclosure.

Referring to FIG. 1, a meat-aging system 10 may include a meat-aging apparatus 100 and a server 200.

The meat-aging apparatus 100 may age meat. The type of meat may vary. The meat type may include beef, pork, chicken, lamb, etc. Aged meat may mean that the meat fermented by enzyme or microorganism is tendered.

The meat-aging apparatus 100 may age meat by adjusting various parameters. The various parameters may include a temperature and humidity in the meat-aging apparatus 100, ventilation of the meat-aging apparatus 100, the size of an internal space of the meat-aging apparatus 100, and light inside the meat-aging apparatus 100.

Specifically, the meat-aging apparatus 100 may include a temperature controller (not shown), a humidity controller (not shown), a ventilation unit (not shown), a photographing unit (not shown), an illumination unit (not shown), a storage (not shown), and a processor (not shown) for adjusting various parameters.

The temperature controller may adjust a temperature inside the meat-aging apparatus 100. The temperature controller may include a temperature sensor, measure the temperature of the meat-aging apparatus 100 at a predetermined time by using the sensor, and release cool air or hot air into the meat-aging apparatus 100 according to the measured temperature.

The humidity controller may adjust humidity inside the meat-aging apparatus 100. The humidity controller may be provide with a humidity sensor, measure the humidity of the meat-aging apparatus 100 at a predetermined time, remove moisture from the meat-aging apparatus 100 according to the measured humidity, or generate moisture and release the moisture into the meat-aging apparatus 100.

The ventilation unit may emit the air inside the meat-aging apparatus 100 to an outside or the outside air to an inside. The ventilation unit may operate according to the temperature and the humidity measured by the temperature controller and the humidity controller, respectively.

The photographing unit, the illumination unit, the storage and the processor will be described in detail with reference to FIG. 2.

According to the above-described embodiment, it is described that the meat-aging apparatus 100 includes the above-described plural elements, but it should be noted that the meat-aging apparatus 100 may be embodied by any combinations of elements.

The meat-aging apparatus 100 may have a shape as shown in FIG. 1, but the present disclosure is not limited thereto. For example, a handle may be engaged with a door of the meat-aging apparatus 100, or the door may be provided at the top of the meat-aging apparatus 100, or the meat-aging apparatus 100 may be combined with an element having a different function.

The meat-aging apparatus 100 may receive recipe information by performing communication with the server 200. The meat-aging apparatus 100 may receive recipe information corresponding to a type or a state of meat from the server 200, and irradiate light to the meat according to recipe information received for aging the meat.

The server 200 may store recipe information for aging meat by using light. The meat-aging apparatus 100 may transmit a request for recipe information for aging the meat to the server 200. The server 200 that receives the recipe information request may transmit various recipe information stored in the server 200 to the meat-aging apparatus 100. The meat-aging apparatus 100 may be provided with data for determining the type, state and aging degree of meat from the server 200, and determine the type, state and aging degree of meat. The aging degree may be divided into 1 to 10 steps depending on the degree of aging. In this case, a first step may be a state where meat is first stored in the meat-aging apparatus 100, and a tenth step may be a state where the meat reaches the target aging degree. The server 200 and information exchange between the server 200 and the meat-aging apparatus 100 will be described in detail according to various example embodiments with reference to FIGS. 8A and 8B.

Figure 2:
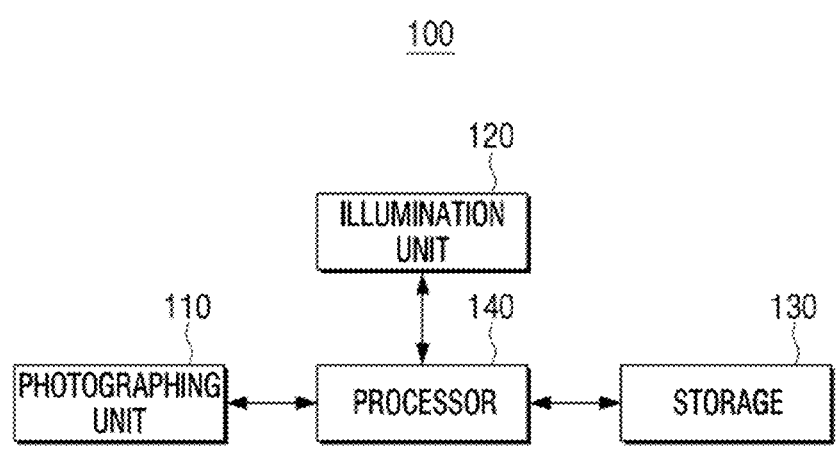
FIG. 2 is a block view illustrating configuration of a meat-aging apparatus according to an embodiment of the present disclosure.

Referring to FIG. 2, each element of the meat-aging apparatus 100 may be described in detail. The repetition of explanation will be omitted.

FIG. 2 is a block view illustrating configuration of a meat-aging apparatus 100 according to an embodiment of the present disclosure.

Referring to FIG. 2, the meat-aging apparatus 100 may include a photographing unit 110, an illumination unit 120, a storage 130 and a processor 140.

The photographing unit 100 may photograph meat stored in the meat-aging apparatus 100. For example, the photographing unit 110 may be embodied as a camera. In this case, the camera may include a plurality of cameras, and the plurality of cameras may help identify a type or state of meat at different angles. The photographing unit 110 may provide the photographed image to the processor 140.

The illumination unit 120 may irradiate the meat with light. The illumination unit 120 may be preferably implemented by a light emitting diode (LED), but may be implemented with various types of illumination such as an incandescent lamp, a fluorescent lamp, and a halogen lamp. The LED will be described as an example of the illumination unit 120.

Specifically, the LED may be illumination using light generated when electrons move within a semiconductor. Examples of the LED may include Red LED, Green LED and Blue LED, and combination thereof to produce almost all colors. In addition, the LED may generate not only visible light of Red, Green and Blue but also ultraviolet light having a longer wavelength than that of the visible light and ultraviolet light having a longer wavelength than that of the visible light. The wavelength depending on the type of light may be infrared light (3000 nm to 1 mm), red (620 nm to 750 nm), orange (590 nm to 620 nm), yellow (570 nm to 590 nm), green (495 nm to 570 nm), blue (450 nm to 495 nm), purple (380 nm to 450 nm) and ultraviolet light (315 nm to 400 nm).

In addition, the illumination unit 120 may include a plurality of illuminations to irradiate light to the entire meat. For example, when the meat-aging apparatus 100 is six-sided, the illumination unit 120 may include six illuminations, one on each of six sides.

The storage 130 may store recipe information for aging meat according to the type or state of meat.

The recipe information may include information regarding at least one of wavelength, intensity, irradiation time of light to be irradiated to the meat for aging meat according to the type or state of the meat. The recipe information may include information regarding at least one of wavelength, intensity, irradiation time of light to be irradiated to the meat depending on the aging degree of meat to age meat with different degrees of aging according to the type or state of meat. The intensity (or energy density) of light may be expressed in $mW/cm^2$, but may be expressed in lux (lx), lumen (lm), light flux ($\mu mol \cdot s^{-1}$). In this case, the light intensity may be preferably at least 20 $mW/cm^2$.

For example, assuming that the meat is pork, and 10 (ten) days have passed since the date of slaughter, the recipe information corresponding to the type or state of meat may include irradiating red light to the meat at the intensity of 20 $mW/cm^2$ for 6 (six) hours, and irradiating green light to the meat at the intensity of 30 $mW/cm^2$ for 7 (seven) hours.

For example, assuming that the meat is beef, and the beef has been frozen for 3 (three) days after 7 (seven) days from the date of slaughter, the recipe information corresponding to the type or state of meat may include irradiating yellow light to the meat at the intensity of 25 $mW/cm^2$ for 20 (twenty) hours, irradiating green light to the meat at the intensity of 40 $mW/cm^2$ for 30 (thirty) minutes, and irradiating red light to the meat at the intensity of 20 $mW/cm^2$ for 5 (five) hours.

The storage 130 may store an image indicating the type or state of meat and further store an image indicating the aging degree of meat. The images indicating the type, state and aging degree of meat may variously photographed and stored according to the type, state and aging degree of meat. In this case, the type, portion, state and aging degree of meat may be tagged to each of the images indicating the type, state, and aging degree of meat. In addition, the images indicating the type, state and aging degree of meat may be provided from the server 200 and updated.

The processor 140 may control each element of the meat-aging apparatus 100.

The processor 140 may determine the type or state of meat based on a photographed image. The processor 140 may further determine a portion of each type of meat.

The processor 140 may compare the photographed image with the stored image and determine the type or state of meat.

As an example of determining the type of meat, if the meat is pork belly, the pork belly may be usually shaped like multiple layers of lean meat and fat, lean meat may be usually pink and fat may be usually white. The processor 140 may determine distribution of pink areas and white areas from the image of pork belly. The processor 140 may compare the determined color distribution with a plurality of images of meat stored in the storage 130. When a coincidence between the photographed image of pork belly and at least one of the plurality of images of meat stored in the storage 130 is equal to or greater than a predetermined value, the processor 140 may determine the type of photographed image of meat as pork with reference to the type of meat corresponding to the image stored in the storage 130. In addition, the processor 140 may determine the meat of the photographed image as pork belly.

As another example, if the meat is sirloin, the sirloin may be usually made up of lean meat, marbling (fat) that cuts lean meat in various directions and tendons (tough portion). The lean meat may be usually red, the marbling may be white, and the tendons may be light yellow. The processor 140 may determine color distribution of read areas, white areas and soft yellow areas from the photographed image of sirloin. The processor 140 may compare the determined color distribution with a plurality of images of meat stored in the storage 130. When a coincidence between the photographed image of sirloin and at least one of the plurality of images of meat stored in the storage 130 is equal to or greater than a predetermined value, the processor 140 may determine the type of photographed meat as beef with reference to the type of meat corresponding to the image stored in the storage 130. The processor 140 may determine the type of photographed meat as sirloin.

The processor 140 may determine the state of meat based on the determined information of the type or portion of meat.

For example, if the type of meat is pork belly, lean meat of the pork belly may be usually changed to black color with age. The processor 140 may determine color distribution of soft black areas and white areas in the photographed image of pork belly. The processor 140 may compare the determined color distribution with the stored plurality of images of type of meat. When a coincidence between the photographed image of pork belly and one of the stored plurality of images of meat is equal to or greater than a predetermined value, the processor 140 may determine a state of meat according to the type and portion of meat corresponding to the image stored in the storage 130.

The state of meat may be at least one of a state according to an elapsed time after the meat is slaughtered, a state according to an elapsed time after the meat is frozen, a state according to an elapsed time since the frozen meat is defrosted, and a state according to an aging degree of the meat. For example, the image indicating the type or state of meat stored in the storage 130 may be an image photographed at a predetermined time after the meat is slaughtered.

The processor 140 may determine the aging degree of meat based on the photographed image.

The processor 140 may compare the photographed image of meat with the stored image and determine the aging degree of meat.

For example, in a process of aging pork belly, for example, bacon may be made when the salting pork belly is cured and smoked, and the process of making bacon may involves meat-aging. When the pork belly is salted and aged, the pork belly may grow rich in color. The processor 140 may determine the color distribution of the darker lean area and the darker fat area in the photographed image of pork belly. The processor 140 may compare the determined color distribution with the stored plurality of images indicating the aging degree of meat in the storage 130. When a coincidence between the photographed image of pork belly and one of the plurality of images indicating the aging degree of meat is equal to or greater than a predetermined value, the processor 140 may determine the aging degree of pork belly with reference to the aging degree of meat corresponding to the image.

The processor 140 may control an illumination unit to irradiate light to the meat according to recipe information corresponding to the determined type or state of meat for aging meat.

For example, if the meat is pork, and 10 (ten) days have passed after the date of slaughter, the processor 140 may control the illumination unit 120 to irradiate red light to the meat at the intensity of 20 mW/cm$^2$ for 6 (six) hours and green light to the meat at the intensity of 30 mW/cm$^2$ for 7 (seven) hours based on the recipe information corresponding to the type or state of meat.

For example, if the meat is beef, and the beef has been frozen after 7 (seven) days from the date of slaughter, the processor 140 may control the illumination unit 120 to irradiate yellow light to the meat at the intensity of 25 mW/cm$^2$ for 20 (twenty) hours, green light to the meat at the intensity of 40 mW/cm$^2$ for 30 (thirty) minutes, red light to the meat at the intensity of 20 mW/cm$^2$ for 5 (five) hours based on the recipe information corresponding to the type or state of meat.

The processor 140 may control the illumination unit 120 to irradiate light for sterilizing the meat. The processor 140 may operate in a sterilization mode or an aging mode according to a user input.

The light for sterilizing and aging the meat may be light of different wavelengths. In the spectrum of light, the blue color series usually may have a wavelength of 450 nm to 495 nm. Light having a wavelength equal to or shorter than the wavelength of the blue color series may have a sterilizing power. Thus, the processor 140 may control the illumination unit 120 and select the wavelength of light to sterilize meat.

Figure 3:
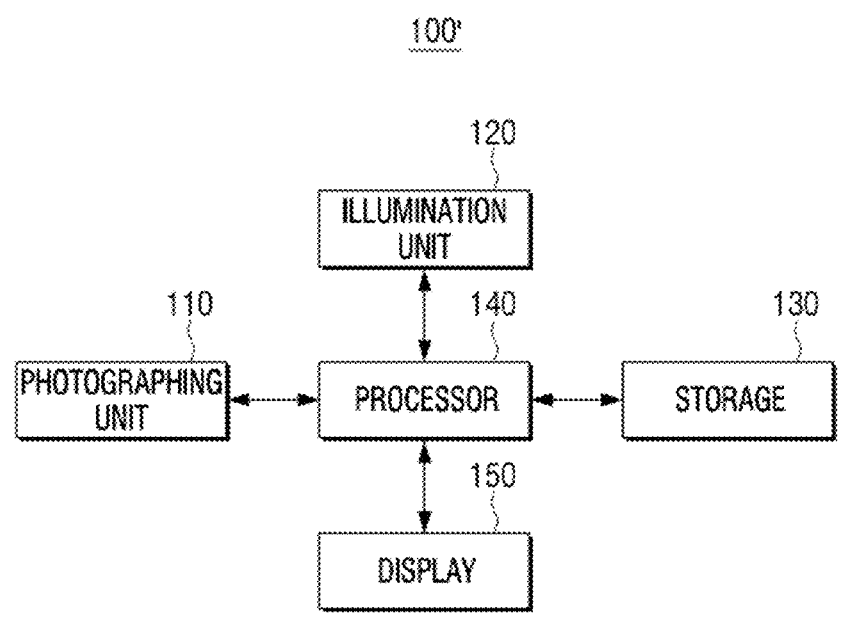
FIG. 3 is a block diagram illustrating configuration of a meat-aging apparatus according to another embodiment of the present disclosure.

FIG. 3 is a block diagram illustrating configuration of a meat-aging apparatus according to another embodiment of the present disclosure.

Referring to FIG. 3, the meat-aging apparatus 100 may include a photographing unit 110, an illumination unit 120, a storage 130, a processor 140 and a display 150. The repetition of explanation of FIG. 2 will be omitted.

The display 150 may various images. The display 150 may provide user interface for receiving a user input. The display 150 may be provided as a touch screen. An example of information exchange between a user and the meat-aging apparatus 100 through the display 150 will be described in detail with respect to the drawings below.

Figure 4A:
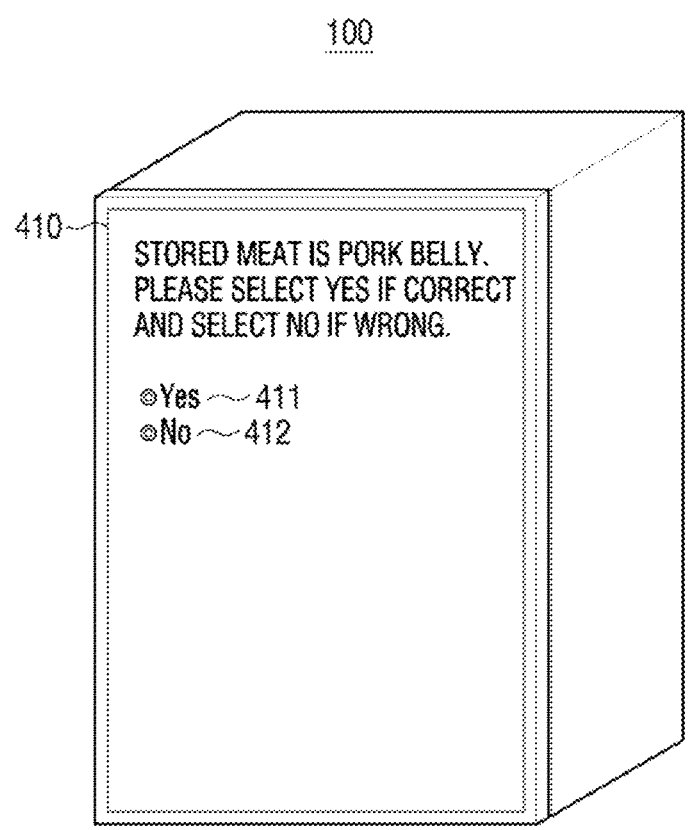
FIGS. 4A and 4B are views illustrating GUIs according to an embodiment of the present disclosure.
Figure 4B:
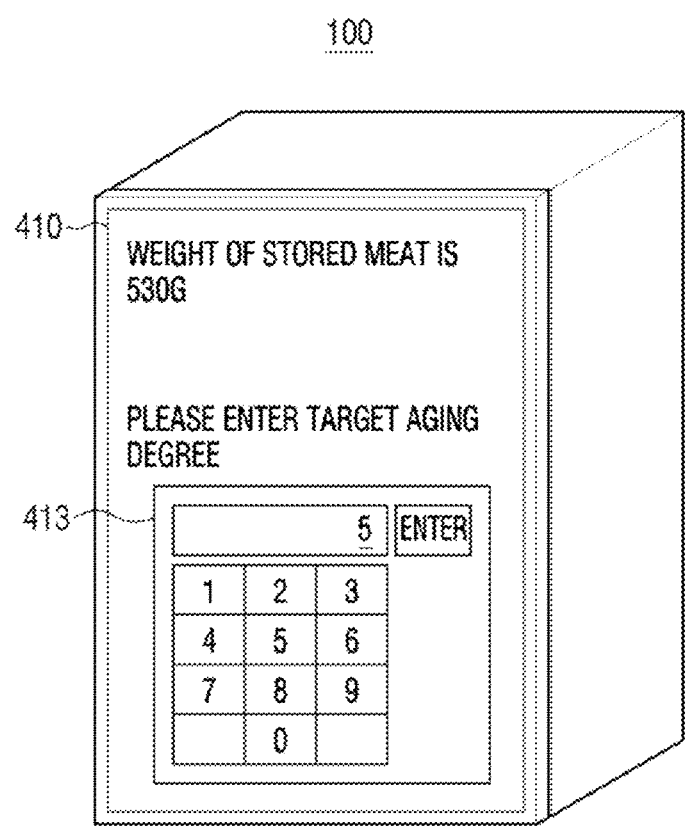

FIGS. 4A and 4B are views illustrating GUIs according to an embodiment of the present disclosure.

Referring to FIG. 4A, the processor 140 may receive the photographed image of meat from the photographing unit 110 when the meat is stored in the meat-aging apparatus 100 and determine the type and portion of meat. The processor 140 may generate GUI such as 'the stored meat is pork belly' and output the GUI on a display 410, thereby providing information regarding the type and portion of the stored meat.

The processor 140 may generate GUI, for example, 'select yes if correct, or no if wrong' to be confirmed whether the type and portion of meat determined by the processor 140 is correct and display the GUI on the display 410.

FIG. 4B shows the result of selecting 'yes' in FIG. 4A. Referring to FIG. 4B, the meat-aging apparatus 100 may further include a weight sensor (not shown) on the bottom. The processor 140 may receive the weight of meat measured by the weight sensor, generate GUI, for example, 'the weight of stored meat is 530 g' and display the GUI on the display 410.

The processor 140 may generate GUI such as 'please input a target aging degree' and an aging degree input window 413 and display the GUI and the aging degree input window 413 on the display 410 for receiving a target aging degree of meat from a user.

The processor 140 may provide information regarding the present aging degree of meat to the user. The processor 140 may control the controller 110 to photograph meat at a predetermined time, determine the aging degree of meat based on the photographed image of meat at the predetermined time, and provide the information regarding the determined aging degree of meat. The predetermined time may be set to, for example, ten minutes, thirty minutes, one hour, etc., and the time may be set by a user input. An example for providing the state of meat will be described with respect to FIG. 5.

Figure 5:
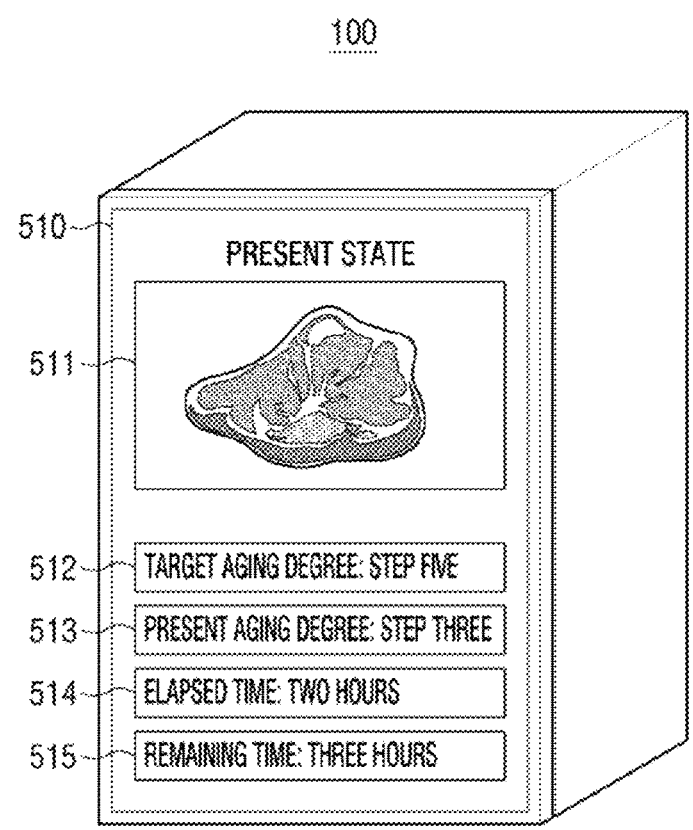
FIG. 5 is a view provided to explain a GUI according to another embodiment of the present disclosure.

FIG. 5 is a view provided to explain GUI according to another embodiment of the present disclosure.

Referring to FIG. 5, the processor 140 may determine the aging degree of meat at a predetermined time and provide various information relating to the determined aging degree of meat. The user may accurately identify the present state of meat in real time during an aging process of meat.

For example, the processor 140 may control a display 510 to display an image of meat 511 photographed by the photographing unit 110 to be displayed in real time. The processor 140 may generate and display GUI indicating, for example, a target aging degree 512, a present aging degree 513, an elapsed time 514, a remaining time 515. The target aging degree 512 may be predetermined by the type or state of meat, or set by a user input. The present aging degree 513 may be determined by the processor 140 and set by a user input. The elapsed time 514 may be a time from when the meat is stored in the meat-aging apparatus 100, and the remaining time 515 may be a time until when the meat-aging is completed.

The processor 140 may age the meat based on a predetermined target aging degree and a meat-aging degree.

The processor 140 may determine the aging degree of meat, select recipe information for aging meat according to the type or state of meat based on the predetermined target aging degree and the aging degree of meat, and irradiate light to the meat according to the selected recipe information.

The processor 140 may determine the aging degree of meat based on the image of meat photographed by the photographing unit 110. The description thereof has been described above, and therefore the detailed description will be omitted.

The processor 140 may determine the aging degree of meat based on a user input, and the detailed description thereof will be made with reference to FIG. 6.

Figure 6:
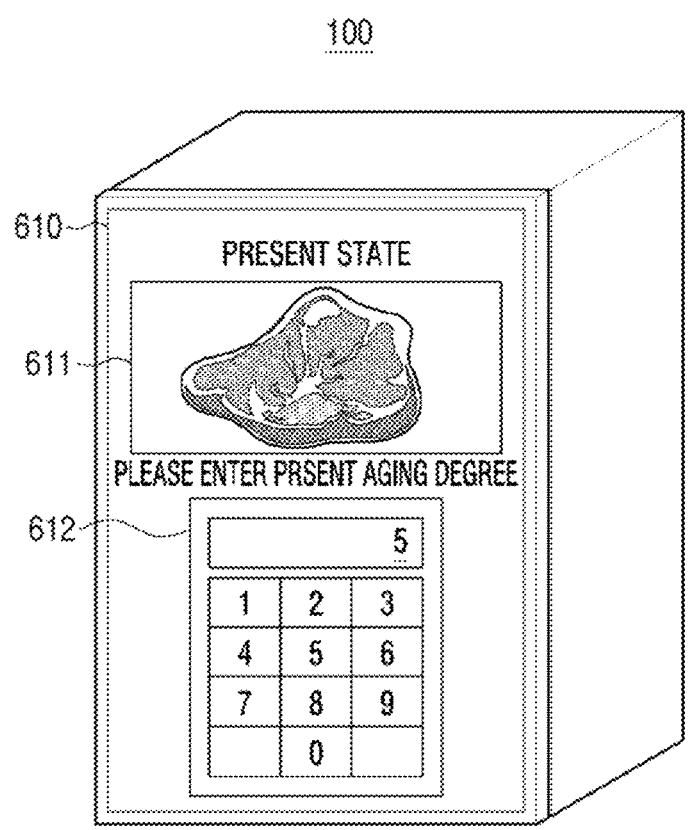
FIG. 6 is a view provided to explain a GUI for receiving a user input according to an embodiment of the present disclosure.

FIG. 6 is a view provided to explain GUI for receiving a user input according to an embodiment of the present disclosure.

Referring to FIG. 6, the processor 140 may control a display 610 to display an image of meat 611 photographed by the photographing unit 110 so that a user may easily determine the present state of meat.

The processor 140 may generate and display GUI such as 'please input a present aging degree' and an aging degree input window 612 to receive an aging degree of meat from a user. In response to a user command with respect to the aging degree of meat being input, the processor 140 may preferentially consider a user command and determine an aging degree of meat.

In the similar manner, the processor 140 may generate GUI (not shown) such as 'please input a target aging degree' to receive the target aging degree.

The processor 140 may select recipe information where the irradiation time of light to be irradiated to the meat is relatively long as a difference between a predetermined target aging degree and an aging degree of meat increases. The recipe information may include information with respect to the irradiation time of light to be irradiated to the meat for aging the meat. The description thereof will be made with an example with reference to FIGS. 7A and 7B.

Figure 7A:
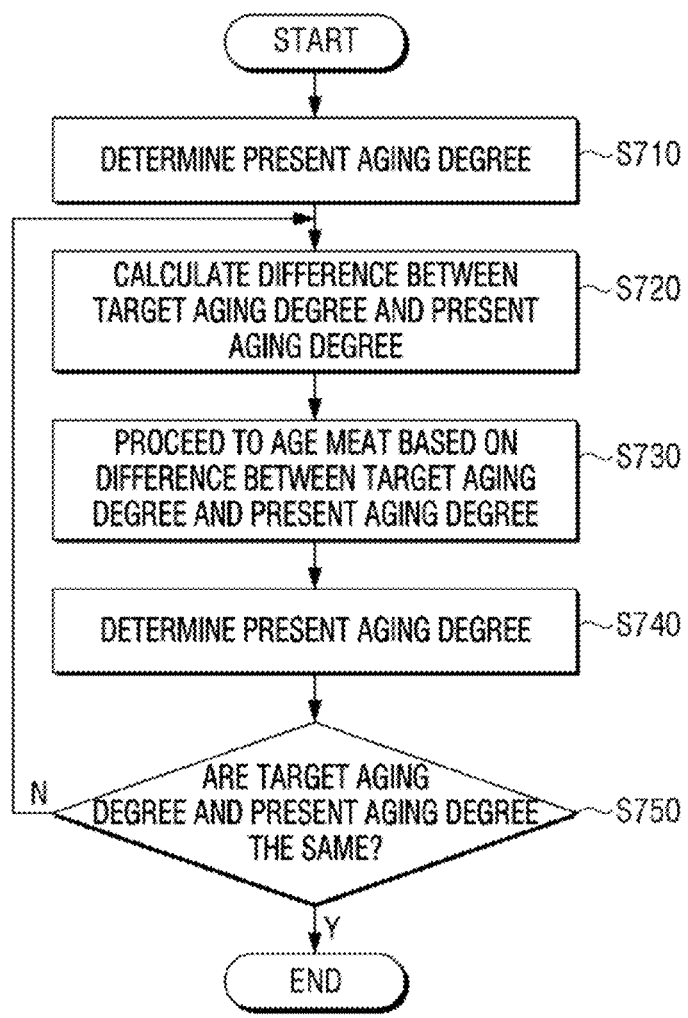
FIG. 7A is a flowchart provided to explain an aging process of meat according to an embodiment of the present disclosure.

FIG. 7A is a flowchart provided to explain an aging process of meat according to an embodiment of the present disclosure.

Referring to FIG. 7A, the processor 140 may determine a present aging degree of meat (hereinafter, referred to as a present aging degree) at step S710. The present aging degree may be determined by the meat image photographed by the photographing unit 110. When a present aging degree input by a user is different from a present aging degree determined based on the meat image photographed by the photographing unit 110, the processor 140 may determine a present aging degree input by a user as a present aging degree. The processor 140 may determine a present aging degree by prioritizing a present aging degree input by a user.

The processor 140 may calculate a difference value between a target aging degree and a present aging degree at step S720. The target aging degree may be predetermined or determined by a user input.

The processor 140 may proceed to age the meat based on a difference value between a target aging degree and a present aging degree. The processor 140 may proceed to age the meat by selecting recipe information corresponding to the difference value between the target aging degree and the present aging degree.

For example, when a difference value between the target aging degree and the present aging degree is 1 (one), the processor 140 may proceed to age the meat according to recipe information of irradiating light for sterilization for 360 minutes. When a difference value between the target aging degree and the present aging degree is 3 (three), the processor 140 may irradiate light for sterilization for 360 minutes, and stop irradiating light for 60 minutes, and lastly, irradiate light for aging for 360 minutes according to recipe information for aging. When a difference value between the target aging degree and the present aging degree is 6 (six), the processor 140 may irradiate light for sterilization for 360 minutes, stop irradiating light for 30 minutes, and lastly irradiating light for aging for 720 minutes according to recipe information for aging. The processor 140 may select recipe information where the irradiation time of light to be irradiated to meat is relatively long as a difference between a predetermined target aging degree and a meat-aging degree increases.

The processor 140 may determine whether a present aging degree reaches a target aging degree at step S740. The processor 140 may terminate an aging process when the present aging degree is the same as the target aging degree at step S750-Y. The processor 140 may return to step S720 and proceed an aging process again when the present aging degree does not reach the target aging degree (or when the two are not the same).

Figure 7B:
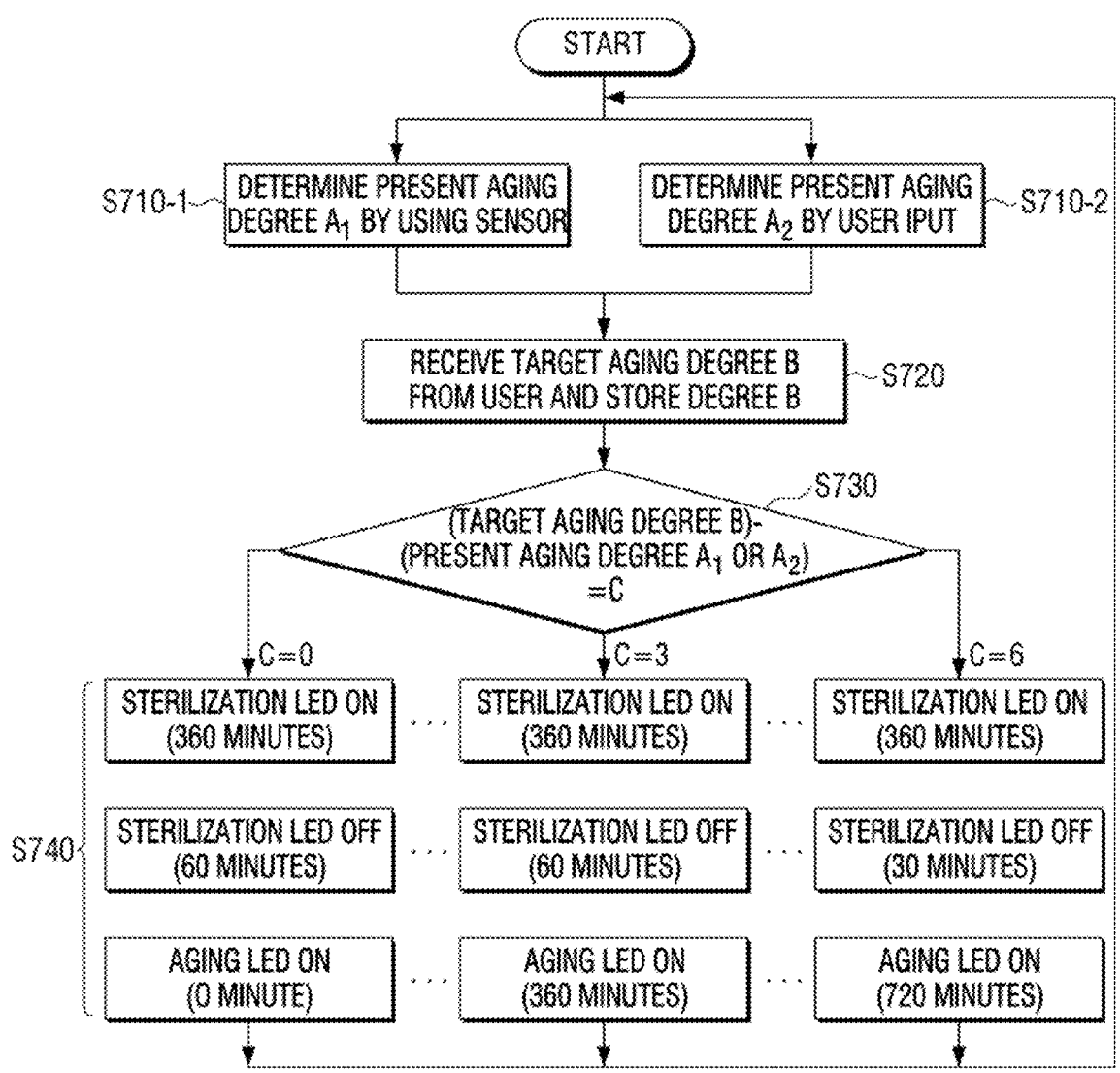
FIG. 7B is a flowchart provided to explain an aging process of meat according to another embodiment of the present disclosure.

FIG. 7B is a flowchart provided to explain an aging process of meat according to another embodiment of the present disclosure.

Referring to FIG. 7B, the processor 140 may determine a present aging degree A1 by using a sensor such as a camera at step S710-1, or determine a present aging degree by directly receiving a present aging degree A2 from a user at step S710-2. The processor 140 may receive and store a target aging degree B from a user at step S720. The processor 140 may determine a present aging degree by prioritizing a present aging degree by a user input A2 than a present aging degree determined by using a sensor A1 when the present aging degree by the user input A2 is the same as the present aging degree determined by using the sensor A1. The processor 140 may calculate a difference C between a target aging degree B and a present aging degree A1 or A2 (preferably, A). The processor 140 may age the meat by using recipe information corresponding to a value C. For example, when the value C is 0 (zero), the processor 140 may turn on sterilization LED for 360 minutes, and turn off the sterilization LED for 60 minutes based on recipe information. According to another embodiment, when the value C is 3 (three), the processor 140 may turn on the sterilization LED for 360 minutes, turn off the sterilization LED for 60 minutes, and turn on aging LED for 360 minutes according to recipe information for aging meat. For another example, when the value C is 6 (six), the processor 140 may turn on the sterilization LED for 360 minutes, turn off the sterilization LED for 30 minutes, and turn on the aging LED for 720 minutes based on the recipe information.

After aging the meat based on the recipe information, the processor 140 may repeat all steps from steps S710-1 and S710-2.

Referring to FIG. 1, the meat-aging system 10 may include the meat-aging apparatus 100 and the server 200.

The meat-aging apparatus 100 may use the recipe information stored in the server 200. The meat-aging apparatus 100 may receive recipe information corresponding to the type or state of meat from the server 200, and irradiate light to the meat according to the recipe information received for aging meat.

In response to a recipe transmission request being received from the meat-aging apparatus 100, the server 200 may select at least one of the recipe information corresponding to the type or state of meat based on at least one of user preference and download count and transmit the selected recipe information to the meat-aging apparatus 100. The server 200 may use the recipe information and the user preference received from the meat-aging apparatus 100 and update the pre-stored recipe information and user preference.

The server 200 may store the recipe information in order based on at least one of the user preference and the download count. In this case, the server 200 may respond to a recipe transmission request from the meat-aging apparatus 100 and transmit the recipe information stored in order to the meat-aging apparatus 100. The meat-aging apparatus 100 that receives recipe information may provide recipe information so that one of the recipe information could be selected. The detailed description thereof will be made with reference to FIGS. 8A and 8B.

Figure 8A:
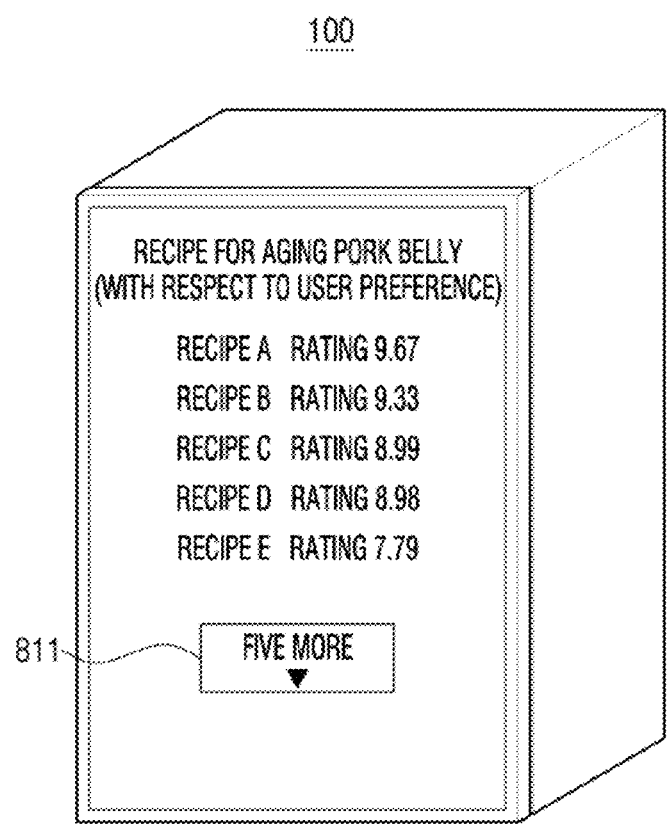
FIGS. 8A and 8B are views provided to explain GUIs for providing recipe information according to an embodiment of the present disclosure.
Figure 8B:
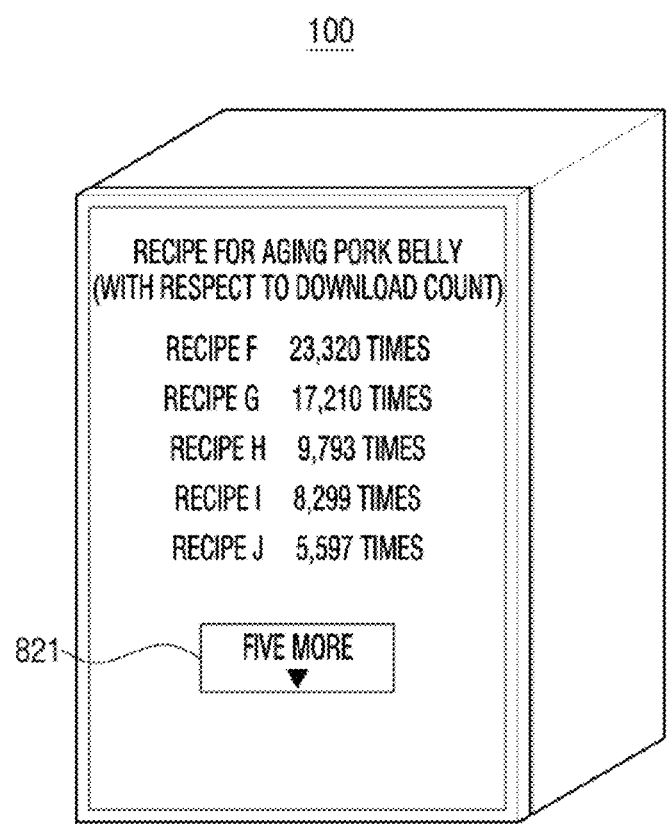

FIGS. 8A and 8B are views provided to explain GUIs for providing recipe information according to an embodiment of the present disclosure.

Referring to FIG. 8A, the meat-aging apparatus 100 may display a result of the recipe information of aging pork belly requested to the server 200. The meat-aging apparatus 100 may display the recipe information sequentially arranged with reference to the user preference. For example, the processor 140 may display recipe information having ratings of recipes A to E. The processor 140 may further generate and display a GUI 811 for receiving an input for additional recipe information.

Referring to FIG. 8B, the meat-aging apparatus 100 may display recipe information sequentially arranged with reference to the download count of recipe information. For example, the processor 140 may display the recipe information having ratings of recipes F to J. The processor 140 may additionally generate and display a GUI 821 for receiving an input for additional recipe information.

Referring to FIGS. 8A and 8B, in response to recipe information being selected, the server 200 may update at least one of the preference and the download count of the selected recipe information. The preference of recipe information may be information separately received from a user.

When a user operates the meat-aging apparatus 100 in accordance with user's preference for aging meat, the meat-aging apparatus 100 may record times to irradiate light for aging and for sterilization to meat, generate recipe information and transmit the generated recipe information to the server 200. In this case, the server 200 may store the transmitted recipe information.

The meat-aging apparatus 100 may transmit at least one of history information of meat and the photographed image of meat to the server 200 and the server 200 may determine the type or state of meat based on at least one of the history information and the image received from the meat-aging apparatus 100, and transmit the recipe information corresponding to the determined type or state of meat to the meat-aging apparatus 100. The history information of meat may be a meat type, a meat state, an elapsed time after storage, an elapsed time after slaughter, an elapsed time after defrosting, an aging degree, etc. The history information may be determined by the meat-aging apparatus 100 itself or generated by a user input.

The server 200 may pre-store various history and images according to the type or state of meat. The server 200 may compare the history information and images received from the meat-aging apparatus 100 with the pre-stored history information and images, identify the type or state of meat, determine recipe information corresponding to the determined type or state of meat, and transmit the result to the meat-aging apparatus 100. Comparing the received history information and images with the pre-store history information and images by the server 200 may be the same as determining the type, state and aging degree of meat by the meat-aging apparatus 100. Thus, the repetition will be omitted.

The meat-aging apparatus 100 may be embodied as a refrigerator (not shown) or embodied as one of elements of the refrigerator.

Figure 9:
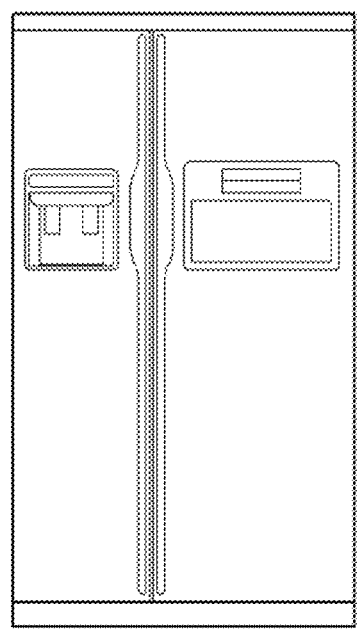
FIG. 9 is a view provided to explain a refrigerator according to an embodiment of the present disclosure.

FIG. 9 is a view provided to explain a refrigerator according to an embodiment of the present disclosure.

Figure 10:
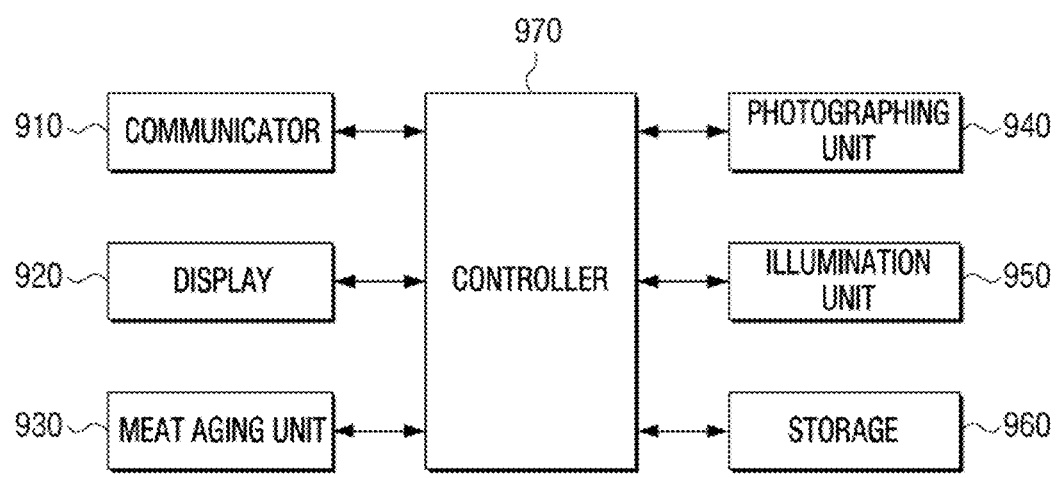
FIG. 10 is a block diagram provided to explain a detailed configuration of a refrigerator according to an embodiment of the present disclosure.

Referring to FIG. 9, a refrigerator 900 may age meat. The refrigerator 900 may include elements of various functions. FIG. 10 will have more details in this regard.

FIG. 10 is a block diagram provided to explain a detailed configuration of a refrigerator according to an embodiment of the present disclosure.

Referring to FIG. 10, the refrigerator 900 may include a communicator 910, a display 920, a meat-aging unit 930, a photographing unit 940, an illumination unit 950, a storage 960 and a controller 970. The refrigerator 900 may include all the elements described above, or may be embodied with the part of the elements, or any combination of the above elements and other elements. The repetition of the above description of the meat-aging apparatus 100 will be omitted.

The communicator 910 may perform communication. The communicator 910 may perform communication with an external server (not shown) and receive various information such as recipe information stored in the external server. The communicator 910 may transmit various information such as the type, state, aging degree of meat determined by the controller 950 to be described below and recipe information selected by a user to the server. The communicator 910 may receive information such as optimum consumption time of meat or food, temperature and humidity suitable for aging meat, popular recipe information for specific period, popular recipe information for specific region, popular recipe information for specific age group, etc.

The communicator 910 may perform communication with a user terminal (not shown) and receive a user input or various information regarding meat-aging.

The communicator 910 may perform communication using various communication methods such as a mobile communication network, for example, WCDMA, HDPA, 3G, 4G, etc., Near Field communication, for example, Bluetooth, Zigbee, Wi-Fi, Internet, PSTN, etc.

The display 920 may display various screens. The display 920 may display a menu for executing a basic program. The menu may include menu items for executing the basic program for providing a basic function of the refrigerator 900.

The display 920 may display various information such as the type, state, target aging degree, present aging degree, recipe information of meat, etc.

The display 730 may be embodied as a Liquid Crystal Display (LCD), an Organic Light Emitting Diode (OLED), a Plasma Display Panel (PDP), etc.

The meat-aging unit 930 may be provided to store and age meat. The meat-aging unit 930 may include a lid to put the meat out and take the meat into the meat-aging unit 930. The meat-aging unit 930 may be equipped with the photographing unit 940 and the illumination unit 950 therein. All of the elements of the meat-aging apparatus 100 may be mounted on the meat-aging unit 930.

The photographing unit 940 may photograph meat stored in the refrigerator 900.

The illumination unit 950 may age meat by irradiating light to meat. For example, the illumination unit 950 may be an LED. The illumination unit 950 embodied with an LED according to an embodiment of the present disclosure will be described in detail with respect to FIGS. 11A to 11D.

FIGS. 11A to 11D are views provided to explain an LED 1100 of an illumination unit 950 according to an embodiment of the present disclosure.

Figure 11A:
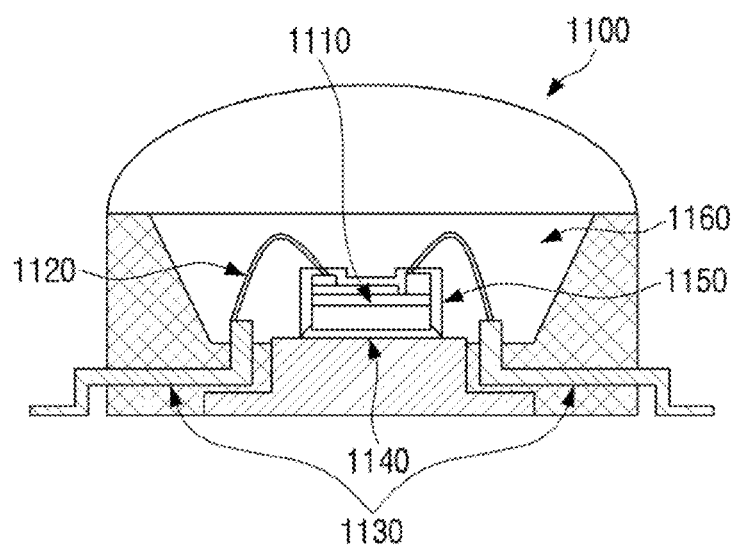
FIGS. 11A to 11D are views provided to explain LED of an illumination unit according to an embodiment of the present disclosure.

Referring to FIG. 11A, the LED 1100 may include an LED chip 1110, a gold wire 1120, a lead frame 1130, a die bond 1140, a phosphor 1150 and an encapsulated material 1160.

Specifically, in the LED 1100, the lead frame 1130 that supplies electricity to the LED chip 1110 and serves as a support, and the LED chip 1110 or a structure including the LED chip 1110 may be engaged with each other by the die bond 1140, the phosphor 1150 may be coated on the LED chip 1110 and the LED chip 1110 coated by the phosphor 150 may be wound by the encapsulated material 1160. The gold wire 112 may connect the LED chip 1110 with the lead frame 1130.

Figure 11B:
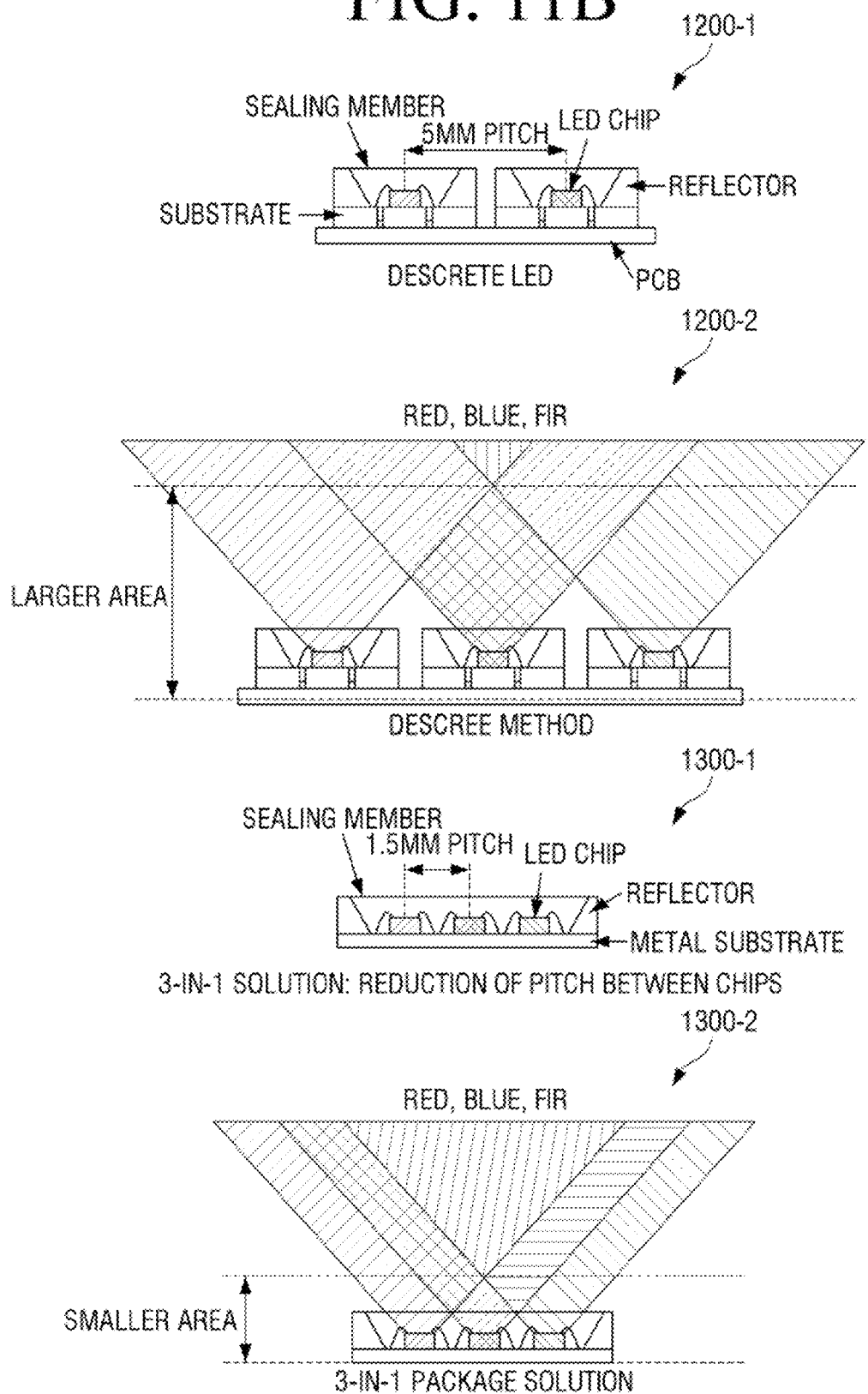

Referring to FIG. 11B, according to an embodiment of the present disclosure, a discrete-type LED and a 3-in-1 type LED may be used.

Discrete-type LEDs 1200-1 and 1200-2 may protect an LED chip and apply a sealing member, which is a transparent material that transmits light to an outside, to each LED chip. However, 3-in-1 type LEDs 1300-1 and 1300-2 may apply a sealing member to a bundle of a plurality of LED chips.

Thus, the 3-in-1 type LEDs 1300-1 and 1300-2 may be implemented with a smaller size area than the discrete type LEDs 1200-1 and 1200-2.

Referring to reference numerals 1200-2 and 1300-2, LEDs of RED, GREEN, and BLUE may be used in the present disclosure. However, depending on utilization, GREEN LED may be replaced by fast infrared (FIR) LED. By doing so, the refrigerator 900 may proceed an aging process by irradiating infrared light sufficiently.

Figure 11C:
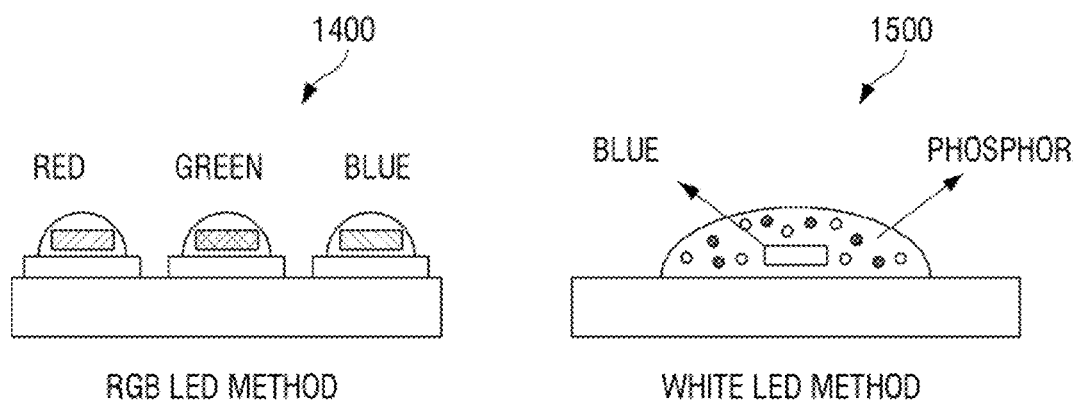

Referring to FIG. 11C, an RGB LED method 1400 and a white LED method 1500 may be used to convert the wavelength of LED light to sterilize and age meat. The RGB LED method 1400 may control each RGB LED to embody light with all different wavelengths. The white LED method 1500 may be a structure where phosphor is applied to the BLUE LED, and light with all different wavelengths may be embodied by controlling only one BLUE LED. Each LED may be controlled by on and off of a switch or controlled by a Phase Width Modulation (PWM) method.

Figure 11D:
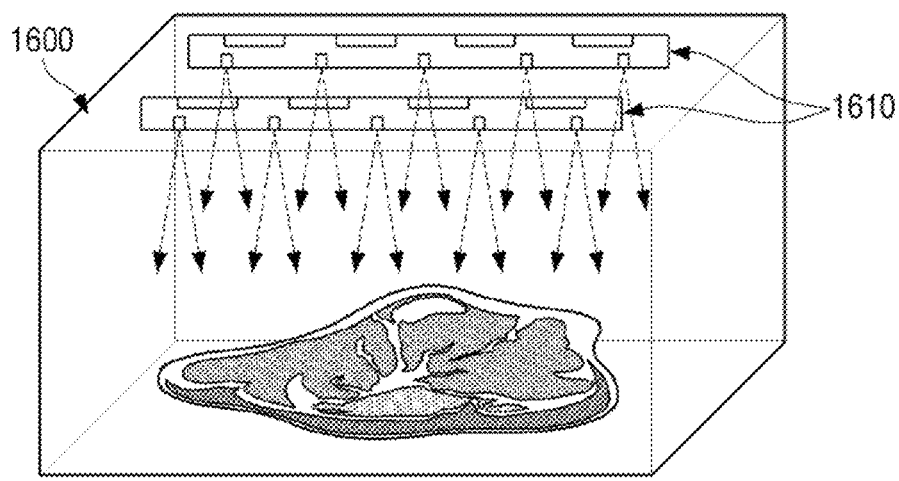

Referring to FIG. 11D, an LED module 1610 may be provided to face the meat at an upper end portion 1600 of the meat-aging unit 930, which can be opened and closed. It should be noted that the LED module 1610 may be provided not only at the upper end portion 1600 but also at another portion of the meat-aging unit 930. In this case, the energy density of the wavelength of the light emitted from the LED module 1610 may be at least 20 mW/cm$^2$.

The storage 960 may store various data and an Operating System (OS) for driving and controlling the refrigerator 900. The storage 960 may store recipe information for aging and sterilizing the meat according to the type or state of meat.

The storage 960 may be implemented as a storage medium such as a nonvolatile memory (e.g., a flash memory), an Electrically Erasable ROM(EEROM), a hard disk, or the like.

The controller 970 may control all elements of the refrigerator 900. Specifically, the controller 970 may maintain temperature of foods stored in a storage of the refrigerator 900 to the lower level to keep is fresh.

The controller 970 may be embodied as a processor 970. Hereinafter, it is assumed that the controller 970 is the processor 970.

The processor 970 may determine the type or state of meat based on the photographed image and control the illumination unit 950 to irradiate light to the meat according to recipe information corresponding to the determined type or state of meat for meat-aging.

The refrigerator 900 may further include a plurality of chambers (not shown) each having a predetermined temperature and a predetermined humidity. The processor 970 may determine the aging degree of meat based on the photographed image of meat, determine a suitable chamber for storing meat among the plurality of chambers according to the aging degree of meat, and provide the information regarding the determined chamber.

The processor 970 may determine the temperatures and humidity of the plurality of chambers for meat-aging. For example, when a target aging degree and a present aging degree is greater than a predetermined value, the processor 970 may determine a chamber of which temperature and humidity is greater than a predetermined value as a chamber suitable for storing the meat. When a target aging degree and a present aging degree is smaller than a predetermined value, the processor 970 may determine a chamber of which temperature and humidity is smaller than a predetermined value as a chamber suitable for storing the meat The refrigerator 900 may further include an input unit (not shown) for receiving a user input for selecting one of recipe information for meat-aging. In response to a user command being input, the processor 970 may control the illumination unit 950 to irradiate light according to the recipe information selected by a user command. The input unit may be the display 920, and in this case, the display 920 may be a touch screen.

The refrigerator 900 may further include a speaker (not shown). The processor 970 may control a speaker to release the determined information by sound. For example, when the stored meat is pork belly, the processor 970 may generate a sentence 'the stored meat is pork belly' and control the speaker to release this information.

The refrigerator 900 may further include a weight sensing device (not shown). For example, the weight sensing device may be an electronic scale. The processor 970 may, in response to weight information of meat being received from the weight sensing device, generate a sentence 'the weight of the stored meat is 700 g' and display the sentence on the display or release the sentence by sound.

The refrigerator 900 may include a barcode recognition unit (not shown). For example, the barcode recognition unit may be embodied as radio frequency identification (RFID) recognition unit. For example, the processor 970 may recognize the barcode of meat (or food) by using the RFID recognition unit and determine the type, state, expiration date of meat, and display the information on the display 920 or release the information by sound using a speaker. The type, state, expiration date, weight and aging degree of meat may be directly input by a user.

The refrigerator 900 may further include a microphone (not shown), and receive food information by voice and recommend an appropriate place for storing food. The description thereof will be made with an example with respect to FIG. 11.

Figure 12:
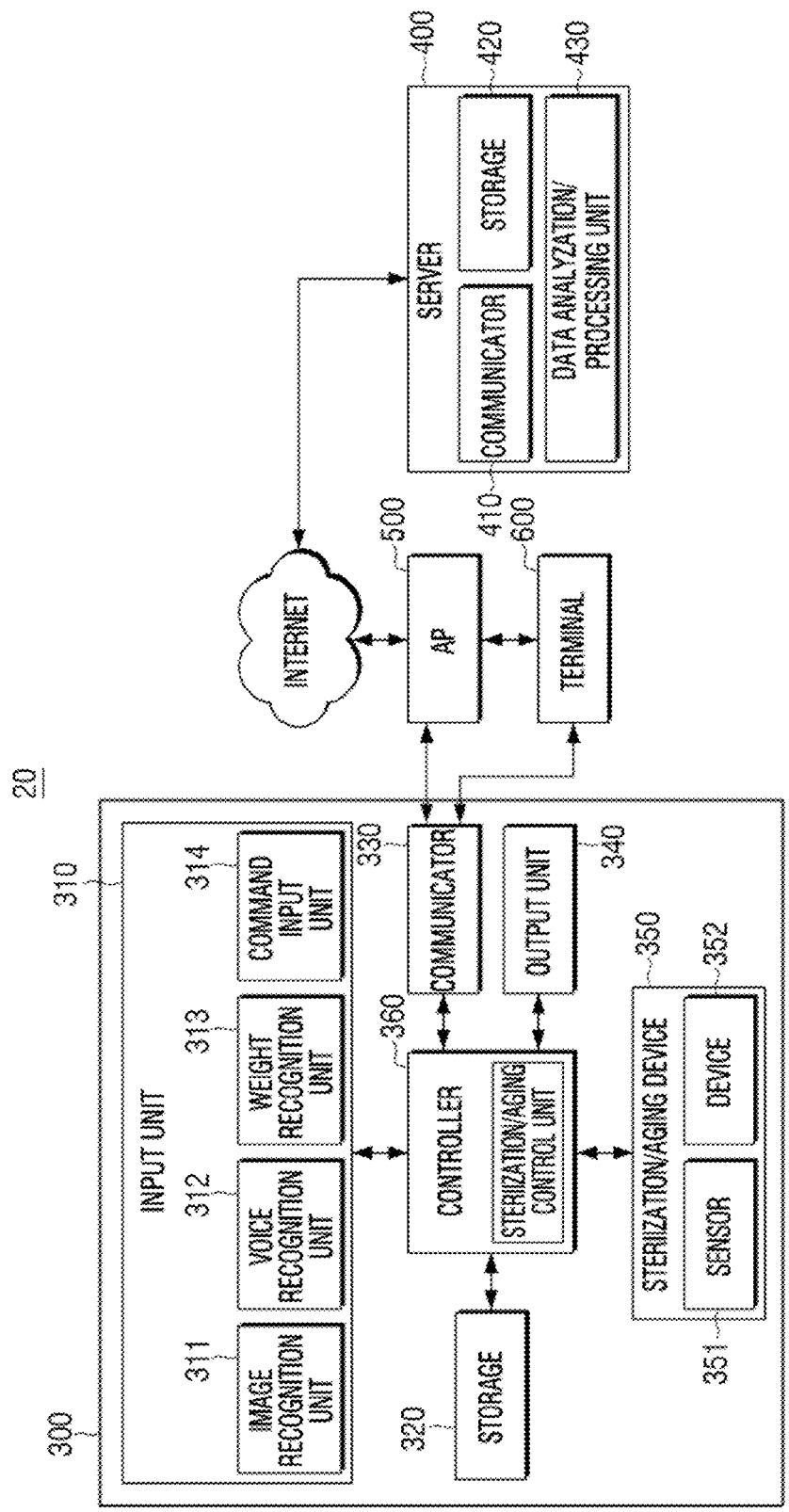
FIG. 12 is a block diagram provided to explain a detailed configuration of a meat-aging system according to another embodiment of the present disclosure.

FIG. 12 is a block diagram provided to explain a detailed configuration of a meat-aging system according to another embodiment of the present disclosure.

Referring to FIG. 12, a meat-aging system 20 may include a refrigerator 300 and a server 400. The refrigerator 300 will be exemplified as the meat-aging apparatus 300, but the present disclosure is not limited thereto. For example, the meat-aging apparatus 300 may be embodied as a microwave oven, an oven, etc. The repetition of explanation of FIG. 10 will be omitted.

The refrigerator 300 may include an input unit 310, a storage 320, a communicator 330, an output unit 340, a sterilization/aging device 350 and a controller 360.

The input unit 310 may receive various inputs regarding food and a user. The image recognition unit 311 may photograph food when the food is input to the refrigerator 300. The image recognition unit 311 may be embodied as a camera. The voice recognition unit 312 may recognize user voice. The voice recognition unit 312 may be embodied as a microphone. The weight recognition unit 313 may sense the weight of food. The weight recognition unit 313 may be embodied as an electronic scale. The command input unit 314 may receive a user command. The command input unit 314 may be embodied as a touch screen and receive a user command by using a touch screen provided in the output unit 314 to be described below.

The storage 320 may store various data. For example, the storage may store recipe information according to the aging state of meat and provide the information to the controller 360.

The communicator 330 may perform communication with the server 400 or the terminal 600. The communicator may perform communication with an access point (AP) 500. The communicator 330 may use LAN, Wi-fi, Li-fi, NFC, or Bluetooth.

The output unit 340 may provide information regarding the present state of the refrigerator. The output unit 340 may be embodied as a display, a speaker, etc. of LCD, OLED, etc. The controller 360 may control the output unit 340 to display the sterilization and aging process of meat. The controller 360 may display the information regarding the present temperature, humidity of the refrigerator, the type and expiration date of the stored food or release this information by sound.

The sterilization/aging device 350 may include a sensor 351 and a device 352. The sensor 351 may sense one of the type and the state of meat. The device 352 may sterilize and age the meat according to the type or state of meat with the LED.

The server 400 may include a communicator 410, a storage 420 and data analyzation/processing unit 430.

The communicator 410 may perform communication with the refrigerator 300 and the terminal 600.

The storage 420 may store recipe information for meat-aging. The storage 420 may update user preference and use frequency of recipe information.

The data analyzation/processing unit 430 may analyze and process various information for meat-aging. For example, the data analyzation/processing unit 430 may analyze the user preference and the use frequency of the recipe information, determine the order of the recipe information according to the analyzed information and transmit the information in order to the refrigerator 300 and the terminal 600.

Examples of the terminal 600 may include a smartphone, a PDA, a PC, etc. The terminal 600 may transmit a user command to the refrigerator 300 and the server 400, or provide the information received from the refrigerator 300 and the server 400 to a user.

Figure 13:
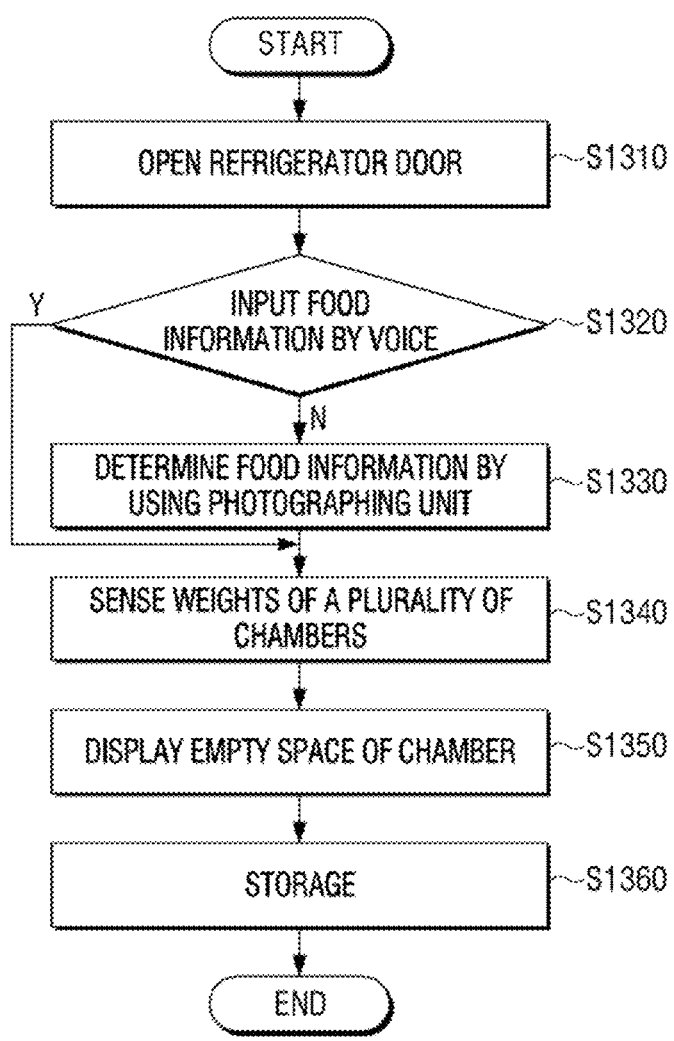
FIG. 13 is a flowchart provided to explain a process for recommending food storage place according to according to an embodiment of the present disclosure.

FIG. 13 is a flowchart provided to explain a process for recommending food storage place according to according to an embodiment of the present disclosure.

Referring to FIG. 13, a door of the refrigerator 900 may be open at step S1310. The processor 970 may determine whether food information is input by voice at step S1320. When the food information is not input by voice (N), the processor 970 may determine food information by using the photographing unit 940 at step S1330. When the food information is input by voice (Y), the processor 970 may skip the step S1130. The processor 970 may sense the weights of a plurality of chambers by using a weight measurement device at step S1340, and display an empty space of the chamber at step S1350. The empty space of the chamber may be displayed by an illumination unit provided in each chamber (e.g., LED). The refrigerator 900 may store food through the above steps at step 1360.

The refrigerator 900 has been exemplified as the meat-aging apparatus 100. However, the meat-aging apparatus 100 may be embodied as various electronic apparatuses such as a micro-oven, an oven, etc.

Figure 14:
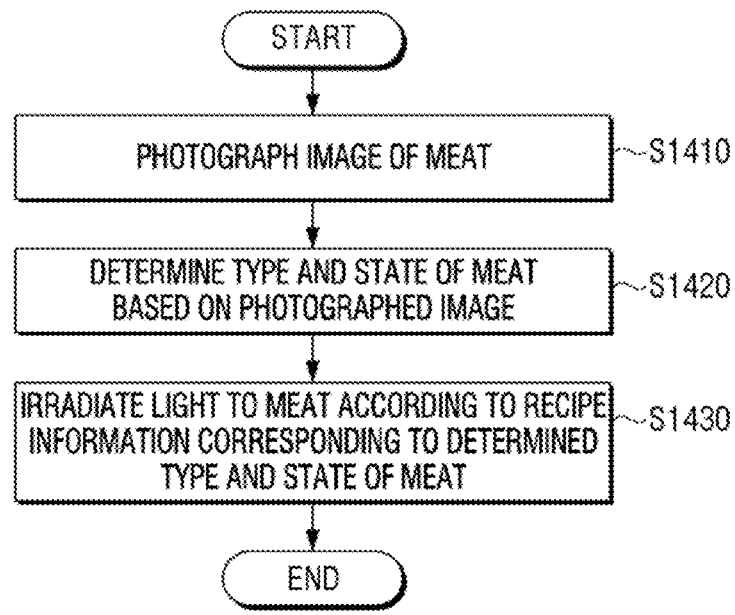
FIG. 14 is a flowchart provided to explain a process of meat-aging of a meat-aging apparatus according to an embodiment of the present disclosure.

FIG. 14 is a flowchart provided to explain a process of meat-aging of a meat-aging apparatus according to an embodiment of the present disclosure.

The meat may be photographed at step S1410, and the type or state of meat may be determine based on the photographed image at step S1420. For meat-aging, light may be irradiated to the meat according to recipe information corresponding to the determined type or state of meat at step S1430.

The recipe information may include at least one of wavelength, intensity and irradiation time of light to be irradiated to the meat for aging meat according to the type or state of meat.

The recipe information may include information regarding at least one of wavelength, intensity and irradiation time of light to be irradiated to the meat by aging degree to age meat with different aging degrees according to the type or state of the meat.

In this case, the meat-aging method may further include irradiating light to the meat to sterilize the meat, and the light to be irradiated to the meat for sterilizing and aging the meat may be light of different wavelengths.

The determining of the type or state of meat may include comparing the photographed image with the image indicating the type or state of meat and determining the type or state of meat.

The state of meat may include a state according to an elapsed time after the meat is slaughtered, a state according to an elapsed time after the meat is frozen, a state according to an elapsed time since the frozen meat is defrosted and a state according to an aging degree of the meat.

The photographing of the meat may include photographing the meat at a predetermined time, and the aging of the meat may further include determining the aging degree of meat based on the images photographed at a predetermined time and providing information regarding the determined aging degrees.

The determining of the meat-aging may include comparing the photographed image of meat with the image indicating the aging degree of meat and determining the aging degree of meat.

Figure 15:
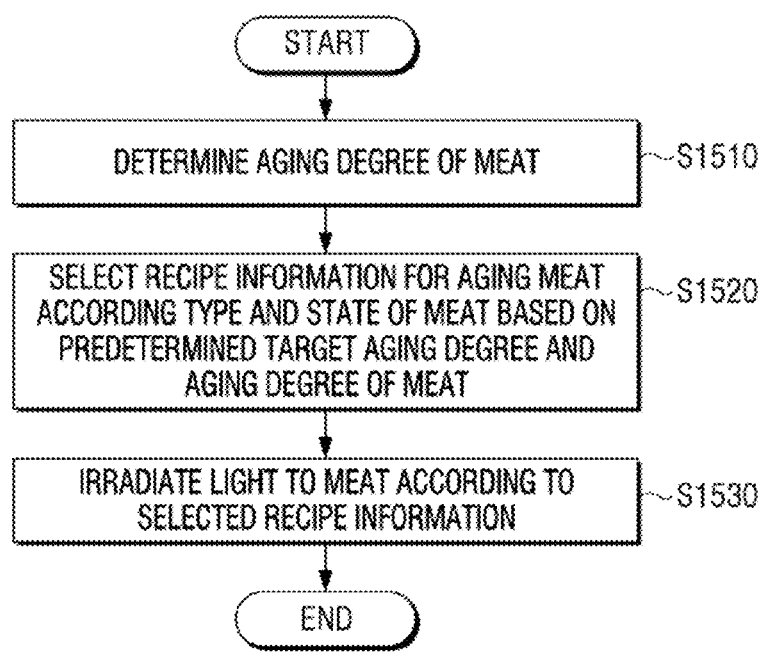
FIG. 15 is a flowchart provided to explain a meat-aging method of a meat-aging apparatus according to an embodiment of the present disclosure.

FIG. 15 is a flowchart provided to explain a meat-aging method of a meat-aging apparatus 100 according to an embodiment of the present disclosure.

The aging degree of meat may be determined at step S1510. The recipe information for meat-aging according to the type or stat of meat may be selected based on a predetermined target meat-aging degree of a meat-aging degree at step S1520. The light may be irradiated to the meat according to the selected recipe information at step S1530.

The determining may include photographing meat, and determining the aging degree of meat according to the photographed image of meat.

The aging of the meat may further include receiving a user command indicating the aging degree of meat, and the determining may include determining the aging degree of meat by prioritizing a user command in response to a user command being input.

The recipe information may include the irradiation time of light to be irradiated to the meat for aging the meat, and the selecting may recipe information where the irradiation time of light irradiated to the meat is relatively long as a difference between a predetermined target aging degree and an aging degree of meat increases.

A meat-aging method of the meat-aging apparatus 100 according to various embodiments of the present disclosure may be embodied as a program code that can be executed by a computer and provided to each server or device to be executed by the processor 970 by being stored in a non-transitory computer readable medium.

A non-transitory computer readable medium that stores a program executing the steps of photographing meat, determining the type or state of meat based on the photographed image, and irradiating light to the meat according to the recipe information corresponding to the determined type or state of meat may be provided.

According to another embodiment, a non-transitory computer readable medium that stores a program executing the steps of determining an aging degree of meat, selecting recipe information for meat-aging according to the type or state of meat based on a predetermined target aging degree and an aging degree of meat, and irradiating light to the meat according to the selected recipe information.

The non-transitory computer readable medium means a medium that semi-permanently stores data and is readable by a device, not a medium that stores data for a short time such as a register, a cache, a memory, etc. Specific examples of non-transitory computer readable medium may include CD, DVD, hard disk, Blu-ray disk, USB, memory card, ROM, and the like.

Although exemplary embodiments have been shown and described, it will be appreciated by those skilled in the art that changes may be made to these exemplary embodiments without departing from the principles and spirit of the present disclosure. Accordingly, the scope of the present disclosure is not construed as being limited to the described exemplary embodiments, but is defined by the appended claims as well as equivalents thereto.

What is claimed is:

1. A meat-aging apparatus, comprising:
   a communicator;
   a display;
   a photographing unit configured to photograph an image of meat stored in the meat-aging apparatus;
   an illumination unit configured to irradiate light to the meat;
   a temperature controller configured to measure a temperature of the meat-aging apparatus;
   a humidity controller configured to measure a humidity of the meat-aging apparatus;
   a ventilation unit configured to emit an air inside the meat-aging apparatus to an outside or the outside air to an inside;
   a storage configured to store at least one of an image indicating a type of meat related to a species of animals and an image indicating a state of meat; and
   a processor configured to:
      determine a color distribution from the photographed image of the meat,
      compare the determined color distribution with a plurality of stored images of meat,
      based on a coincidence between the photographed image of the meat and at least one of the plurality of stored images of meat being equal to or greater than a predetermined value, determine the type and the state of meat with reference to the type and the state of meat corresponding to the stored images,
      control the communicator to receive at least one of recipe information comprising a preference rating and a count of downloads, and corresponding to the determined type and the determined state of the meat from an external server,
      control the display to display the at least one of recipe information with the preference rating sorted by the count of downloads,
      based on one selected recipe information among the at least one of recipe information, control the illumination unit to irradiate light to the meat and control the ventilation unit to ventilate the inside air based on the measured temperature and the measured humidity of the meat-aging apparatus to age the meat at a predetermined target aging degree according to the selected recipe information,
   wherein the selected recipe information includes information irradiation time of light to be irradiated to the meat by aging degree for aging the meat,
   wherein the aging degree is divided into a plurality of levels depending on a degree of aging, and
   wherein a first level of the plurality of levels indicates a state where the meat is first stored in the meat-aging apparatus and a final level of the plurality of levels indicates a state where the meat reaches the predetermined target aging degree.

2. The meat-aging apparatus as claimed in claim 1, wherein the processor is further configured to control the illumination unit to irradiate light for sterilizing the meat to the meat, and
   wherein light for sterilizing and aging the meat is light of different wavelengths.

3. The meat-aging apparatus as claimed in claim 1, wherein the state of the meat includes at least one of the state according to an elapsed time after the meat is slaughtered, the state according to an elapsed time after the meat is frozen, the state according to an elapsed time since the frozen meat is defrosted, and the state according to an aging degree of the meat.

4. The meat-aging apparatus as claimed in claim 1, wherein the processor is further configured to control the photographing unit to photograph the meat at a predetermined time, determine an aging degree of the meat based on the image of meat photographed at the predetermined time, and provide information on the determined aging degree of the meat.

5. The meat-aging apparatus as claimed in claim 1, wherein the storage is further configured to store an image indicating an aging degree of meat, and wherein the processor is further configured to compare the photographed image of the meat with the stored images and determine an aging degree of the meat.

\* \* \* \* \*